United States Patent
Jiang et al.

(10) Patent No.: US 9,413,375 B2
(45) Date of Patent: Aug. 9, 2016

(54) ANALOG AND AUDIO MIXED-SIGNAL FRONT END FOR 4G/LTE CELLULAR SYSTEM-ON-CHIP

(71) Applicant: Broadcom Corporation, Irvine, CA (US)

(72) Inventors: Xicheng Jiang, Irvine, CA (US); Xinyu Yu, San Jose, CA (US); Fang Lin, Los Gatos, CA (US); Yee Ling Cheung, Irvine, CA (US); Michael Inerfield, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/586,866

(22) Filed: Dec. 30, 2014

(65) Prior Publication Data

US 2015/0194979 A1     Jul. 9, 2015

Related U.S. Application Data

(60) Provisional application No. 61/923,523, filed on Jan. 3, 2014.

(51) Int. Cl.
| | |
|---|---|
| *H04B 1/38* | (2015.01) |
| *H04B 1/40* | (2015.01) |
| *H03M 1/18* | (2006.01) |
| *H04B 1/00* | (2006.01) |
| *H04B 1/16* | (2006.01) |
| *H03M 1/66* | (2006.01) |
| *H04M 1/02* | (2006.01) |

(52) U.S. Cl.
CPC ............... *H03M 1/185* (2013.01); *H03M 1/66* (2013.01); *H04B 1/0003* (2013.01); *H04B 1/1646* (2013.01); *H04B 1/40* (2013.01); *H04M 1/0202* (2013.01)

(58) Field of Classification Search
CPC ....... H03M 1/186; H03M 3/30; H03M 3/322; H03M 3/366
USPC ...................... 455/73; 341/126, 136, 143, 155
See application file for complete search history.

(56) References Cited

U.S. PATENT DOCUMENTS

| | | | | |
|---|---|---|---|---|
| 6,123,214 A | * | 9/2000 | Goebel | .............. B65D 21/0204 206/805 |
| 8,952,749 B1 | * | 2/2015 | Tsai | .................... H03H 11/1252 327/556 |
| 2005/0038847 A1 | | 2/2005 | Cheng et al. | |
| 2014/0002187 A1 | | 1/2014 | McPartlin et al. | |

FOREIGN PATENT DOCUMENTS

EP          2360597 A2      8/2011

* cited by examiner

*Primary Examiner* — Lee Nguyen
(74) *Attorney, Agent, or Firm* — McDermott Will & Emery LLP

(57) ABSTRACT

A CMOS analog and audio front-end circuit includes an enhanced analog-to-digital converter (ADC) that achieves a desired signal-to-noise-and-distortion (SNDR) and an analog-front-end transmit (TX) digital-to-analog converter (DAC). The enhanced ADC includes an improved single Op-Amp resonator coupled to a feed-forward loop and can substantially reduce signal transfer function (STF) peaking of the enhanced ADC. The CMOS analog and audio front-end circuit is integrated with a baseband processor.

20 Claims, 9 Drawing Sheets

(a) Conventional headset path (b) Proposed headset path

ANALOG AND AUDIO MIXED-SIGNAL FRONT END FOR 4G/LTE CELLULAR SYSTEM-ON-CHIP

CROSS-REFERENCE TO RELATED APPLICATIONS

This application claims the benefit of priority under 35 U.S.C. §119 from U.S. Provisional Patent Application 61/923,523 filed Jan. 3, 2014, which is incorporated herein by reference in its entirety.

TECHNICAL FIELD

The present description relates generally to integrated circuits, and more particularly, but not exclusively, to an analog and audio mixed-signal front-end for 4G/LTE cellular system-on-chip.

BACKGROUND

A number of wireless communication technologies such as global system for mobile communication (GSM), enhanced data rates for GSM evolution (EDGE), code-division multiple access (CDMA), wideband CDMA (WCDMA), high speed packet access (HSPA), time division synchronous CDMA (TDSCDMA) are available for cellular phone service providers. Social networking demands efficient wireless broadband access. As a combined evolution path for GSM/EDGE, WCDMA/HSPA, and TD-SCDMA/CDMA based service providers, Long Term Evolution (LTE) achieves high spectrum efficiency and a substantial data-rate improvement as compared to that of high-speed downlink packet access (HS-DPA). LTE requirements for low latency and significantly higher bit rates create new challenges, such as the need for a flexible analog interface and for high-fidelity audio. A flexible analog interface enables the baseband chip to be used with any radio frequency integrated circuit (RFIC), and high-fidelity audio enriches user experience.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the subject disclosure, methods and implementations for a CMOS cellular system-on-chip (SoC) with an embedded analog front end (AFE) and enhanced audio are disclosed. The AFE of the subject technology can be employed, for example, in 4G LTE-Advanced/3G/2G applications. The disclosed technology enables a baseband chip to be used with any radio frequency integrated circuit (RFIC), while providing high-fidelity audio for an enriched user experience and can be implemented in a wide range of technology nodes (e.g., below 40 nm).

Figure 1:
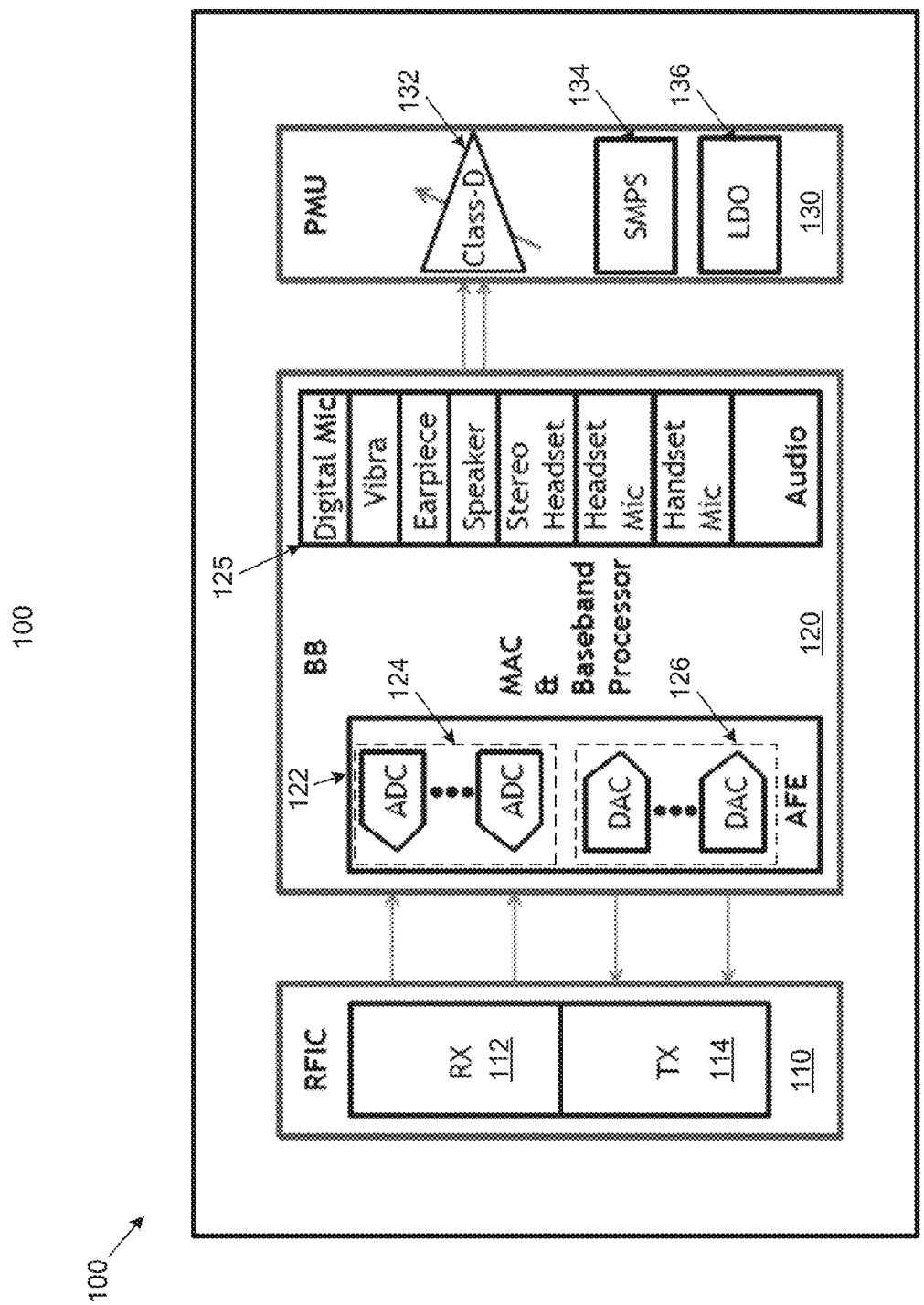
FIG. 1 is a conceptual diagram illustrating an example of a system-on-chip (SoC) platform for implementing an analog and audio mixed-signal front-end for 4G/LTE cellular SoC in accordance with one or more implementations.

FIG. 1 is a conceptual diagram illustrating an example of a system-on-chip (SoC) platform 100 for implementing an analog and audio mixed-signal front-end for 4G/LTE cellular SoC in accordance with one or more implementations of the subject technology. The SoC platform 100 includes an RFIC 110, a baseband processor (hereinafter "baseband") 120 and a power management unit (PMU) 130. The RFIC 110 includes an RF receive (RX) path 112 and an RF transmit (TX) path 114. The baseband 120 includes an analog front-end (AFE) 122, including RX analog-to-digital converters (ADCs) 124 and TX digital-to-analog converters (DACs) 126, and an audio mixed signal 125. The audio mixed signal 125 includes modules (e.g., hardware, firmware, and/or software modules) that perform functionalities related to audio accessories such as, digital microphone, vibrator, earpiece, speaker, stereo headset, headset microphone, handset microphone, etc. The PMU 130 includes, but is not limited to, a class D variable gain amplifier 132, a switch-mode power supply (SMPS) 134 and a low-dropout (LDO) regulator 136.

The analog and audio mixed-signal front ends for 4G/LTE applications of the subject technology are integrated with the baseband SoC for optimal system performance and cost. The 4G/LTE cellular applications require the wireless modem to support multiple generations of communications protocols (e.g., 4G, 3G, etc.) using the same hardware. For example, a narrowband Gaussian-filtered minimum shift keying (GMSK) protocol with 200 kHz channel bandwidth requires ADC performance in excess of 74 dB signal-to-noise-and-distortion ratio (SNDR). The wide-band code-division multiple-access (WCDMA) protocol, for instance, uses 5 MHz channel spacing and can, therefore, achieve a maximum data rate of 2 Mb/s with 46 dB SNDR. On the other hand, broadband LTE, with up to 20 MHz channel bandwidth, requires ADC performance in excess of 63 dB SNDR.

In one or more implementations, an optimal solution for 4G/LTE is to implement the ADC using a wideband sigma-delta architecture in fine geometry, which can be designed using a highly programmable analog sigma-delta modulator, followed by programmable digital filters. This embedded programmability allows trading off speed (e.g., signal bandwidth) and dynamic range (e.g., SNDR), while maintaining the power dissipation at a minimum. Additionally, due to the high oversampling rate, the analog anti-aliasing filters present in the RF block can be simplified. The inherent anti-alias filtering capability of continuous-time sigma-delta (CTΣΔ) ADCs makes them particularly useful in blocking adjacent channels in a receiver application. This feature can help reduce power and area by avoiding the need to add high-order anti-alias filters in front of the ADC. The continuous-time sigma-delta ADCs also provide a power consumption advantage because they do not need the high-power input buffers and reference buffers typically required with switched-capacitor pipeline ADCs. The continuous-time sigma-delta ADCs can also benefit from the optimal design of filter structures to improve the tradeoffs between power and performance.

The continuous-time sigma-delta ADCs, however, have several design sensitivities. For example, they are sensitive to clock jitter. Further, the continuous-time sigma-delta ADCs are sensitive to timing delays. It is understood that, in faster process nodes, phase-locked loop (PLL) jitter performance improves and the timing delays decrease. Additionally, optimized feedback filter structures around the quantizer stage can be used to reduce the sensitivity of the ADC to timing delays. Finally, the continuous-time sigma-delta ADCs are also sensitive to process variations that cause filter time constants to vary and impact the noise transfer function and ADC stability. This sensitivity can be resolved by RC calibration.

Figure 2:
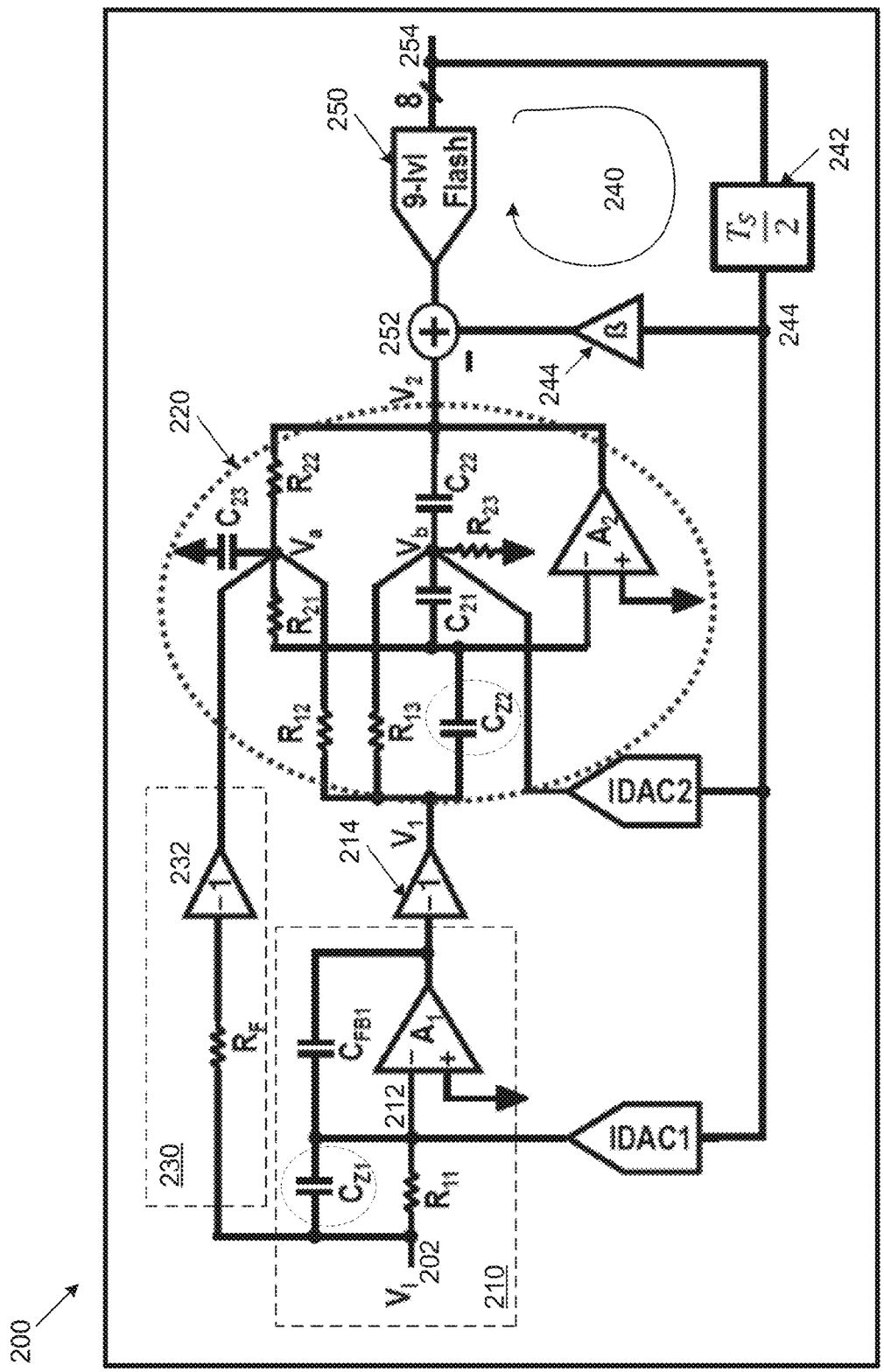
FIG. 2 illustrates an example of an implementation of a continuous sigma-delta analog-to-digital converter (ADC) in accordance with one or more implementations.

FIG. 2 illustrates an example of an implementation of a continuous sigma-delta analog-to-digital converter (ADC) 200 in accordance with one or more implementations of the subject technology. The sigma-delta ADC 200 includes an integrator 210, a core resonator 220, and a quantizer including a flash ADC 250 (e.g., a 9-level ADC). A current first DAC (e.g. IDAC1) feeds back a delayed version (e.g., by a delay element 242) of an output 254 of the flash ADC 250 to a node 212 of the integrator 210. The integrator 210 is formed by an Op-Amp A1, an input resistor R11, a feedback capacitor CFB1, and capacitor Cz1, and is coupled to an input node V1 of the core resonator 220 through an inverter 214.

The core resonator 220 is a single OP-Amp resonator implemented with an Op-Amp A2 and a twin-T structure including a first T, formed by resistors R21 and R22 and a capacitor C23 connected to a node Va, and a second T formed by the capacitors C21 and C22 and a resistor R23 connected to a node Vb.

The twin-T structure by itself lacks the flexibility to implement an optimized transfer function (e.g., substantially flat and ideally with no peaking). An improved twin-T structure can be formed by addition of a resistor R12 connected between nodes V1 and Va, a resistor R13 connected between nodes V1 and Vb, and a capacitor Cz2 between the node V1 and a first node of the capacitor C21. The improved twin-T structure is, however, a feed-forward structure with sufficient flexibility to implement a desired transfer function, but can have a high signal transfer function (STF) peaking (e.g., ~15 dB) and has no inherent anti-aliasing feature. The sigma-delta ADC 200 of the subject technology is a continuous time (CT) sigma-delta ADC, which is a third order circuit that is implemented with only two Op-Amps (instead of three Op-Amps). The sigma-delta ADC 200 has reduced power consumption by using a single-Op-Amp rather than a two-Op-Amp resonator and by reducing the count of the feedback DACs. The sigma-delta ADC 200 has an additional second IDAC (e.g., IDAC2) between a node 244 of the delay element 242 and the node Vb of the core resonator 220 that can reduce the STF peaking to ~5 dB. Another improvement in the sigma-delta ADC 200 is implemented by the feed-forward loop 230, including the resistor RF and an inverter 232 connected between the input node 202 of the integrator 210 and the node Va of the resonator core 220, which further reduces the SFT peaking to a desired low value (e.g., ~1 dB). A further improvement in the sigma-delta ADC 200 is the compensation of additional phase shift, due to the limited bandwidth of the CT sigma-delta ADC, by addition of capacitors Cz1 and Cz2.

In some implementations, the sigma-delta ADC 200 includes a direct feedback loop 240 including the delay element 242 and a gain stage 244 (e.g., with a gain of β). The direct feedback loop 240 can compensate excessive loop delay to reduce the loop filter phase delay. The gain stage 244 can be used to control the voltage swing at the summation node 252.

FIGS. 3A through 3D illustrate examples of a conceptual LTE transmit path 300A and implementations of a respective push-pull DAC 300B of the LTE transmit (TX) path 300A in accordance with one or more implementations of the subject technology. The LTE TX path 300A shown in FIG. 3A includes a TX DAC 310, a local oscillator 314, a power amplifier (PA) 316, an envelope-tracking DAC (ETDAC) 312 and a switching (SW) regulator 318. The PA 316 is implemented with a low power supply rejection (PSR) to save power, and the TX DAC 310 and ETDAC 312 can share the same core. Typically, the TX DAC 310 requires 11-bit performance and the ETDAC 312 requires less than 10 nV/sqrtHz noise density at 30 MHz.

In some implementations, the TX DAC 310 and the ETDAC 312 are implemented by using the push-pull DAC 300B, which is formed by a current DAC 320 and a transimpedance amplifier 330. The current DAC 320 includes complementary switch block 322 including switches S1, S2, S3, and S4, transistors T1 and T2, and resistors R connected between power supply nodes 324 and 326. The resistor R is a regeneration resistor, which is used instead of a stacked transistor implementation shown by T2 and T3 of diagram 300C of FIG. 3C. The replacement of the stacked transistors implementation (e.g., T2 and T3) with the degeneration resistor R and transistor T2 has a number of advantageous features such as lower thermal noise, smaller area, and lower gate leakage.

Figure 3B:
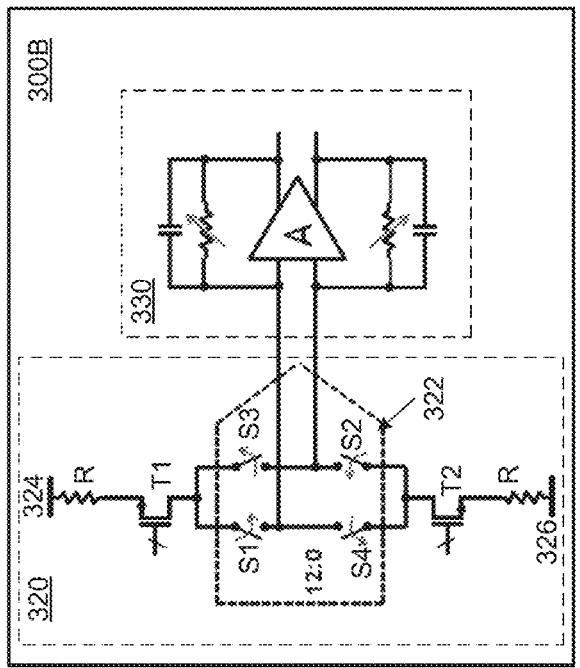
FIGS. 3A through 3D illustrate examples of a conceptual LTE transmit path and implementations of a respective push-pull digital-to-analog converter (DAC) of the LTE transmit path in accordance with one or more implementations.
Figure 3D:
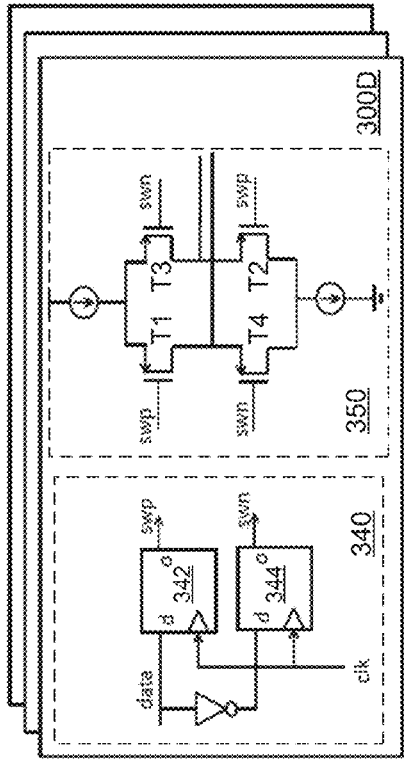
Figure 3A:
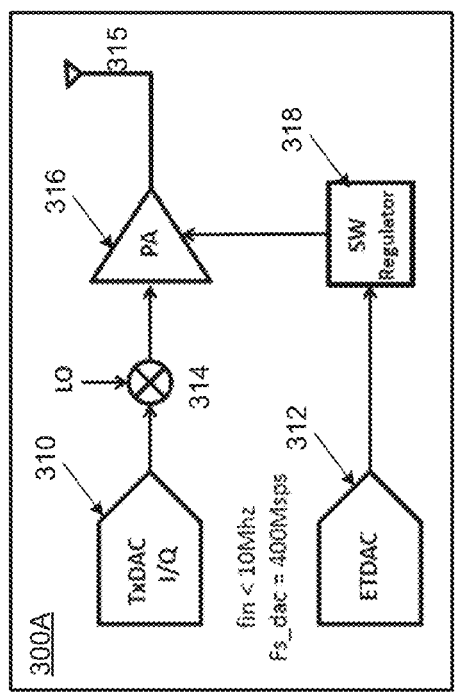
Figure 3C:
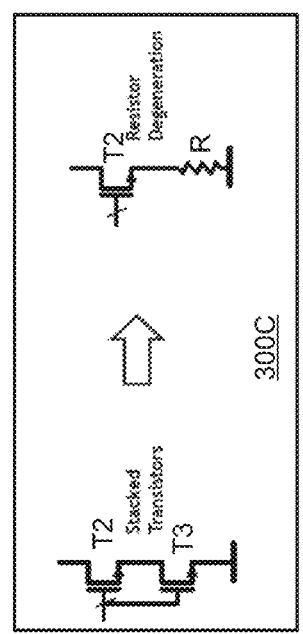

In one or more implementations, the complementary switch block 322 can be implemented with a switch circuit 300D of FIG. 3D. The switch circuit 300D includes a control signal generator 340 and a transistor switch block 350. The control signal generator 340 includes D-flip-flops (D-FFs) 342 and 344, which generate control signals swp and swn by retiming the input data based on input clock clk. The control signals swp and swn are used to control the transistor switches T1, T2, T3, and T4, which realize the switches S1, S2, S3, and S4 of the current DAC 320. In some aspects, the transistor switches T1, T2, T3, and T4 are implemented using PMOS transistors, which can help taming alignment and charge injection.

Figure 4:
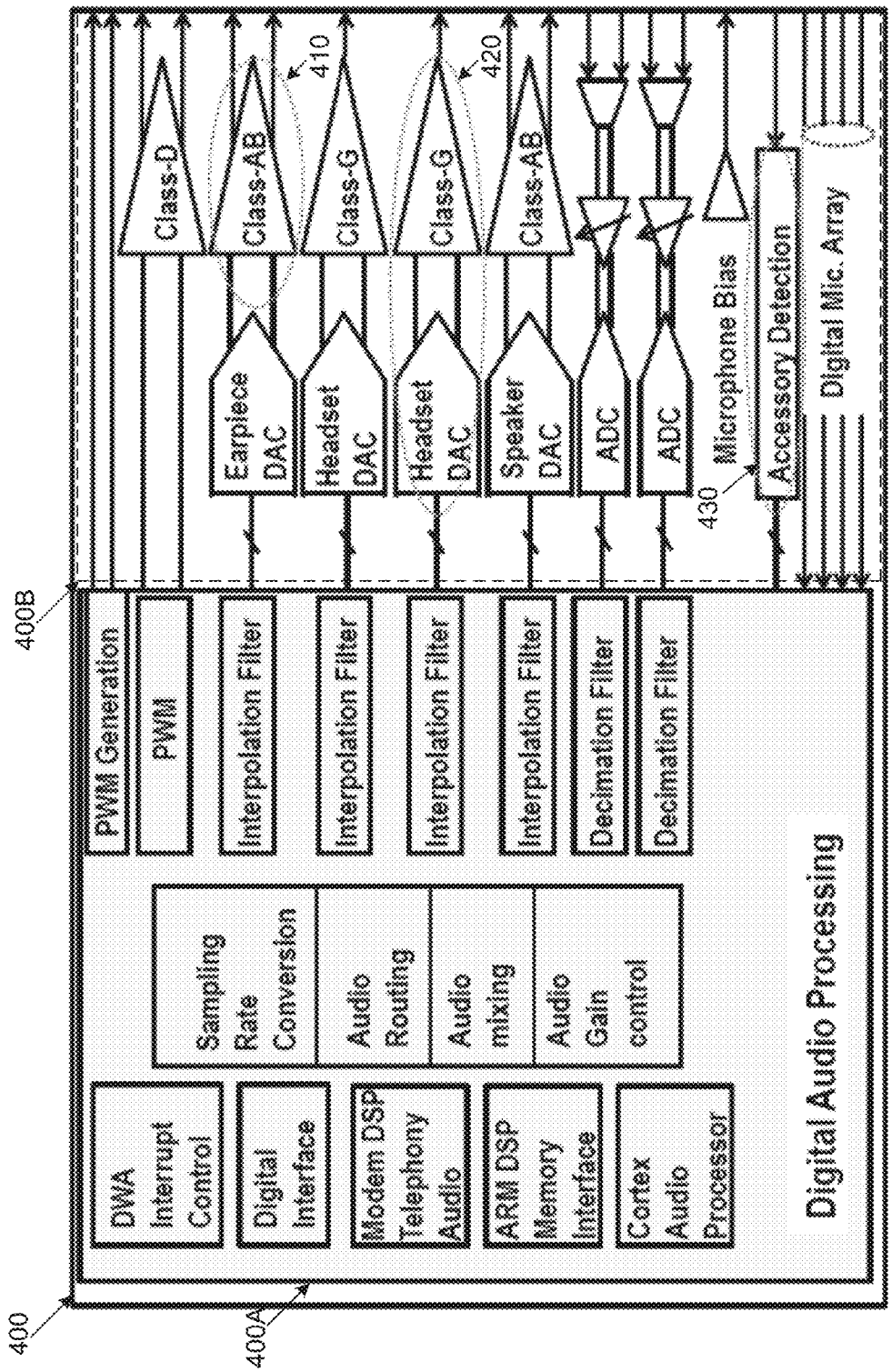
FIG. 4 illustrates a high-level diagram of an example SoC-based audio subsystem in accordance with one or more implementations.

FIG. 4 illustrates a high-level diagram of an example SoC-based audio subsystem 400 in accordance with one or more implementations of the subject technology. The audio subsystem 400 includes a digital audio processing unit 400A and an analog accessories unit 400B. The digital audio processing unit 400A and the analog accessories unit 400B includes known modules as shown in FIG. 4 and description of which are skipped here for brevity. The subject technology allows integration of a number of analog circuits of the analog accessories unit 400B, for example, circuits 410, 420, and 430, in the baseband (e.g., 120 of FIG. 1).

Figure 5A:
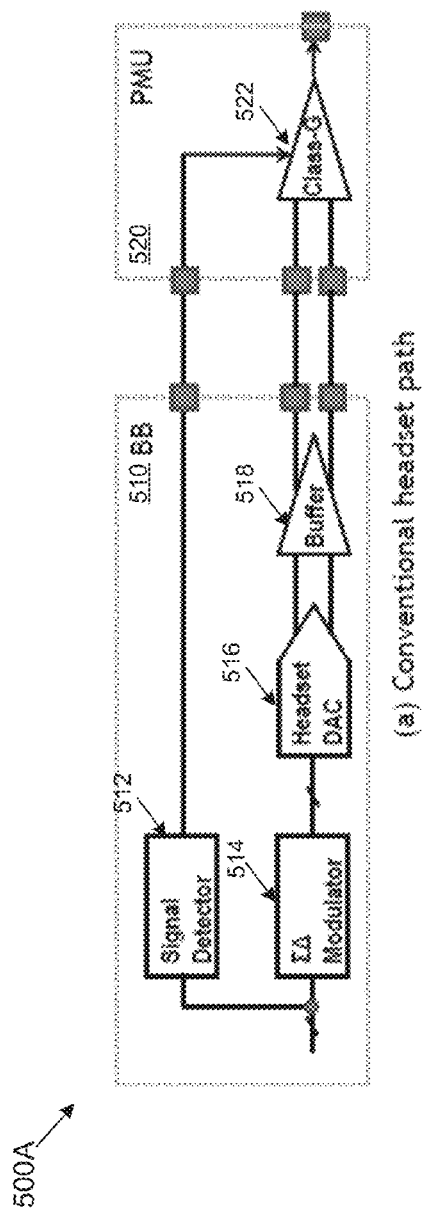
FIGS. 5A-5B illustrate an example of a headset path and integration into a baseband processor of the head set path in accordance with one or more implementations.
Figure 5B:
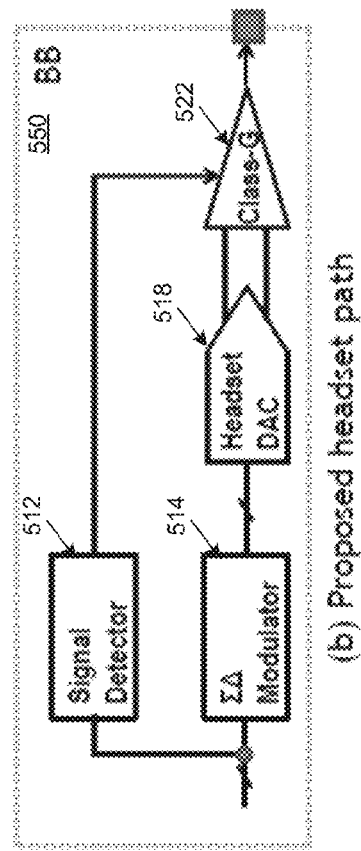

FIGS. 5A-5B illustrate an example of a headset path 500A and integration of the head set path into a baseband processor 550 in accordance with one or more implementations. The headset path 500A, shown in FIG. 5A, depicts a conventional implementation of a headset path 420 of the audio sub-system 400. The headset path 500A includes a baseband 510 and a PMU 520. The baseband 510 includes a sigma-delta modulator 514, a headset DAC 516, a buffer 518 and a signal detector 512 that detects an input signal level and feeds forward the input signal level to a class-G amplifier 522 realized in the PMU 520.

In some implementation of the subject technology, as shown in FIG. 5B, the class-G amplifier 522 is integrated with baseband 550. As a consequence of the integration of the class-G amplifier 522, the need for the buffer 518 is eliminated, which results in reduction of the noise contribution and current consumption. The full integration of class-G amplifier in the baseband simplifies the signal detection for the class-G operation, without concerning delay from chip to chip (e.g., baseband chip to PMU chip). The integration further reduces the number of package pins (e.g., by 9 pins for a stereo channel) and allows achieving a substantially high performance with an optimized low-cost implementation.

Figure 6A:
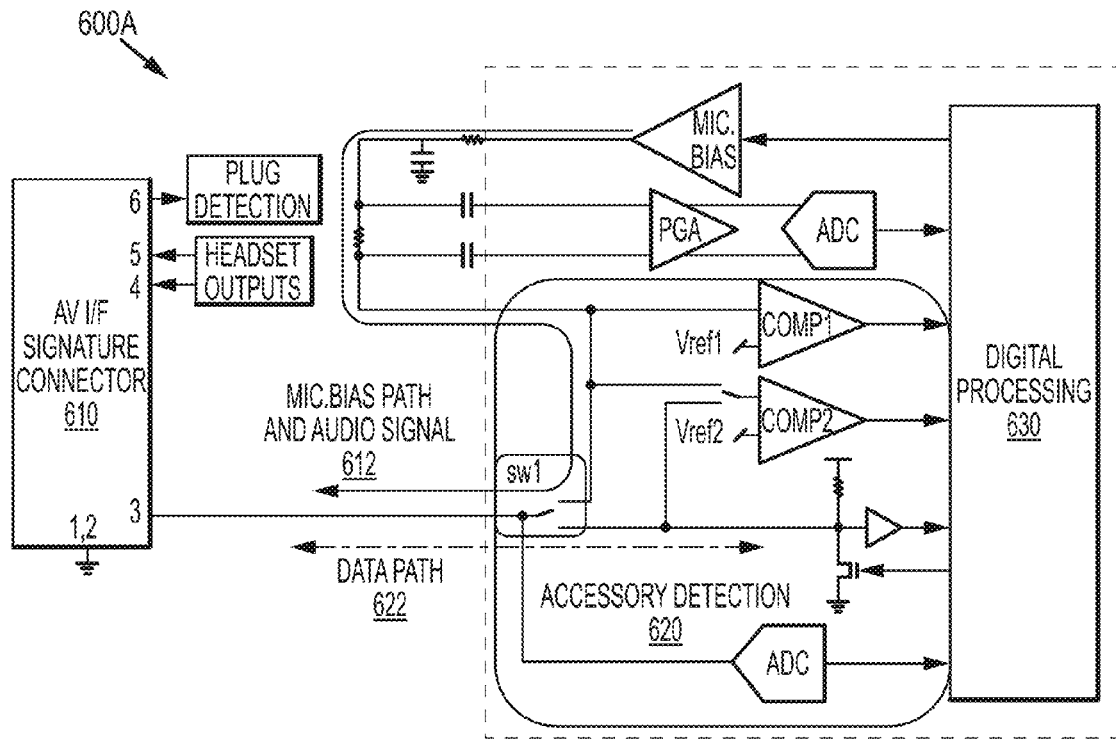
FIGS. 6A-6B illustrate an example of audio capture and accessory detection path and a corresponding switch implementation in accordance with one or more implementations.
Figure 6B:
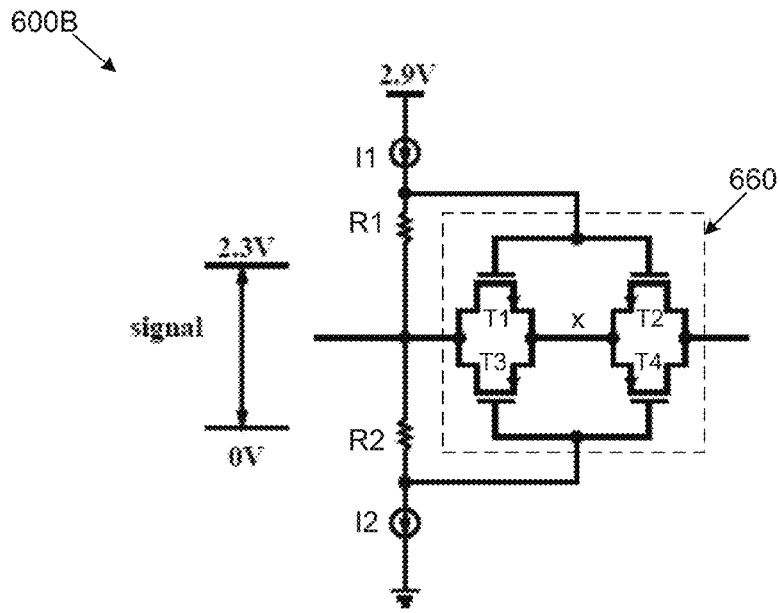

FIGS. 6A-6B illustrate an example of an audio capture and accessory detection path 600A and a corresponding switch implementation 600B in accordance with one or more implementations of the subject technology. The audio capture and accessory detection path 600A, shown in FIG. 6A, includes a connector 610 (e.g., an audio-video (AV) signature connector), a digital processing unit 630, and accessory detection circuitry 620. The accessory detection circuitry 620 includes, among other components, a switch sw1 that closes one of the microphone bias path and audio signal 612 or a data path 622. One issue with the switch sw1 is that its voltage range exceeds the process (e.g., 28 nm process) tolerance limit (e.g., 1.8V).

In one or more implementations, the subject technology implements the switch sw1 using a compound high-voltage tolerant switch 600B of FIG. 6B. The compound switch 600B includes a pair of complementary switches 660 implemented in laterally-diffused metal-oxide semiconductor (LDMOS). In the compound switch 600B the Vgs voltages of the transistors is always less than 1.8V to avoid over-stress, and node x is assigned to different voltage levels when the switch (e.g., 660) is on or off. Furthermore, the level shifter implemented by resistors R1 and R2 and current sources I1 and I2 can improve total harmonic distortion (THD) for a mid-range input voltage (e.g., ~1.1V). In some implementations, the voltage drop across each resistor (R1 or R2) is ~1.3V, and the high-input signals are taken care of by the LDPMOS transistors (e.g., T3 and T4) and the low input signals can pass through the LDNMOS transistors (e.g., T1 and T2). The compound switch 600B can reliably work with an input signal range of approximately 0V-2.3V.

Figure 7A:
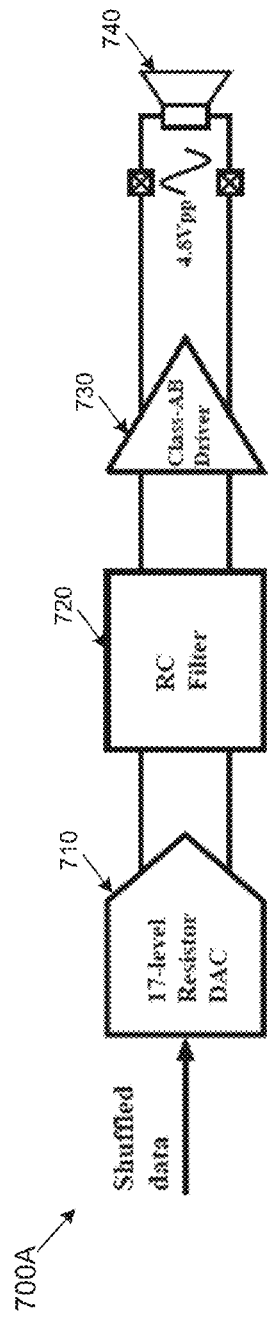
FIGS. 7A-7B illustrate an example of an earpiece DAC and driver and a corresponding output stage in accordance with one or more implementations.
Figure 7B:
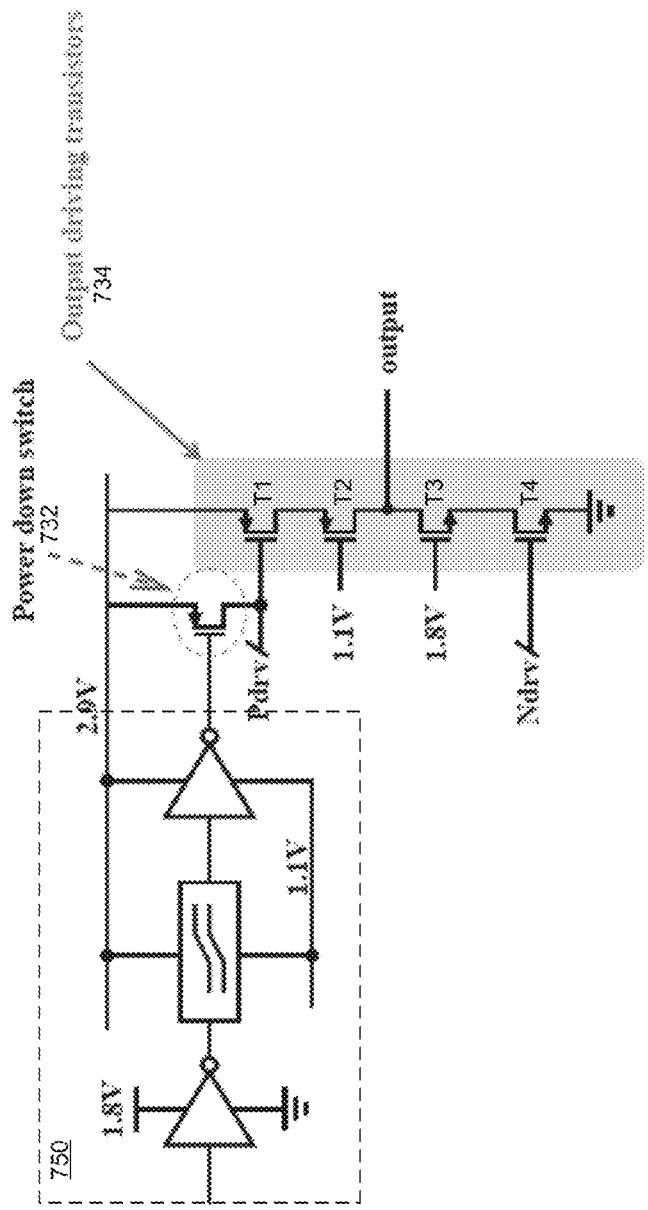

FIGS. 7A-7B illustrate an example of an earpiece DAC and driver 700A and a corresponding output stage 734 in accordance with one or more implementations of the subject technology. The earpiece DAC and driver 700A includes a resistor DAC 710 (e.g., a 17-level DAC) coupled through an RC filter 720 to an amplifier (a class-AB driver) 730 that feeds a speaker 740. The class-AB driver 730 has to provide a fully differential (e.g., peak-to-peak) high output voltage (e.g., ~4.8V) at the input terminals of the speaker 740. The subject technology allows integrating the circuits of the earpiece DAC and driver 700A (e.g., 710, 720, and 730) in the baseband and handling high-voltage output as shown in FIG. 7B. The output stage 734 of the class-AB driver 730 is implemented by a cascode of transistors T1 through T4. The Vgs voltages of the cascode transistors are limited to 1.8 V. The transistor 732 is a power-down switch which is controlled by a level-shift circuit 750 that shifts an input voltage range of 0V-1.8V to a range of 1.1V-2.9V.

Figure 8:
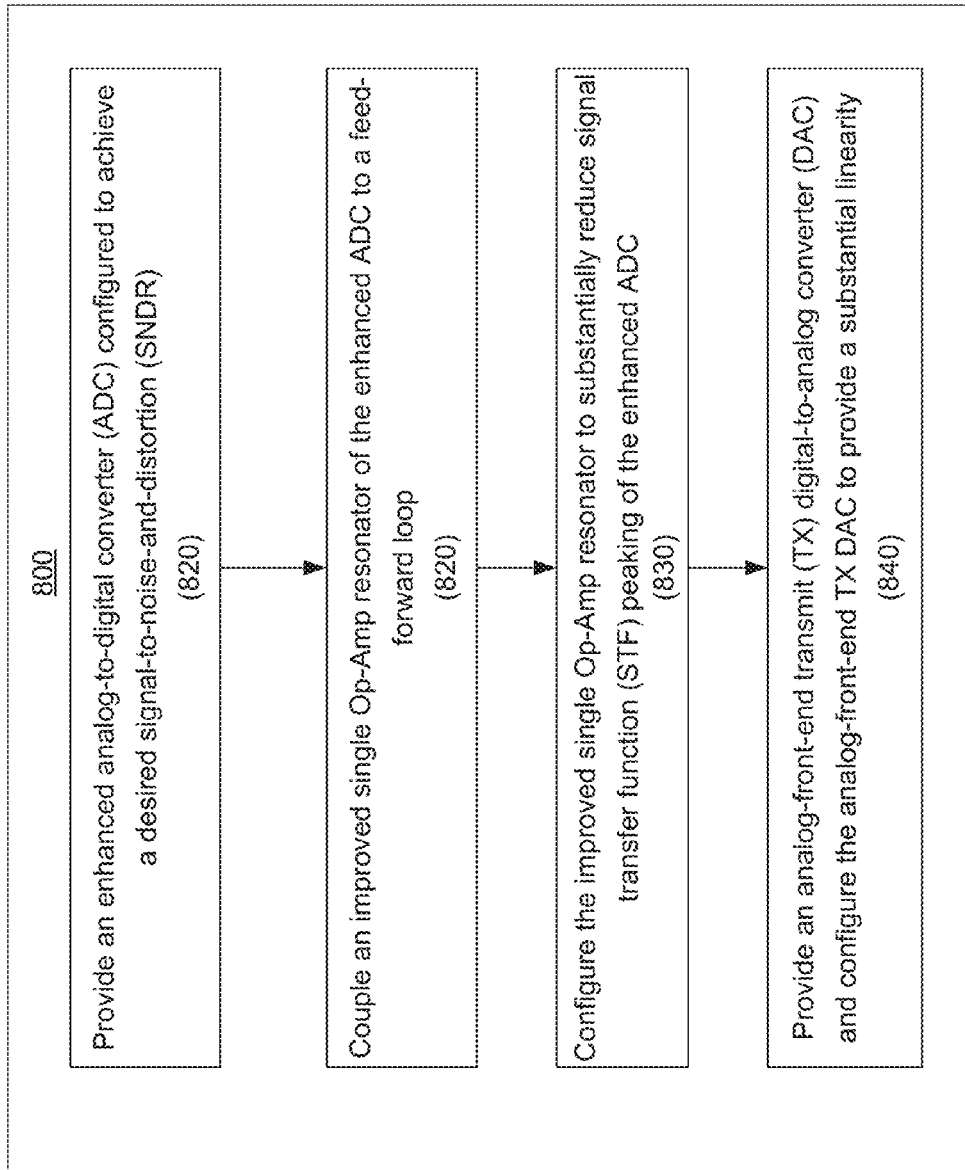
FIG. 8 illustrates an example of a method for providing a CMOS analog and audio front-end circuit in accordance with one or more implementations.

FIG. 8 illustrates an example of a method 800 for providing a CMOS analog and audio front-end circuit in accordance with one or more implementations of the subject technology. Further, for explanatory purposes, the blocks of the example method 800 are described herein as occurring in serial, or linearly. However, multiple blocks of the example method 800 can occur in parallel. In addition, the blocks of the example method 800 need not be performed in the order shown and/or one or more of the blocks of the example method 800 need not be performed.

According to the method 800, an enhanced ADC (e.g., 124 of FIG. 1 and 200 of FIG. 2) is provided to achieve a desired signal-to-noise-and-distortion (SNDR) (810). An improved single Op-Amp resonator (e.g., 220 of FIG. 2) of the enhanced ADC is coupled to a feed-forward loop (e.g., 230 of FIG. 2) (820). The improved single Op-Amp resonator is configured to substantially reduce signal transfer function (STF) peaking of the enhanced ADC (830). An analog-front-end TX DAC (e.g., 126 of FIGS. 1 and 300B of FIG. 3B) is provided and is configured to provide a substantial linearity (840). The enhanced ADC and the analog-front-end TX DAC are integrated with a baseband processor (e.g., 120 of FIG. 1).

Figure 9:
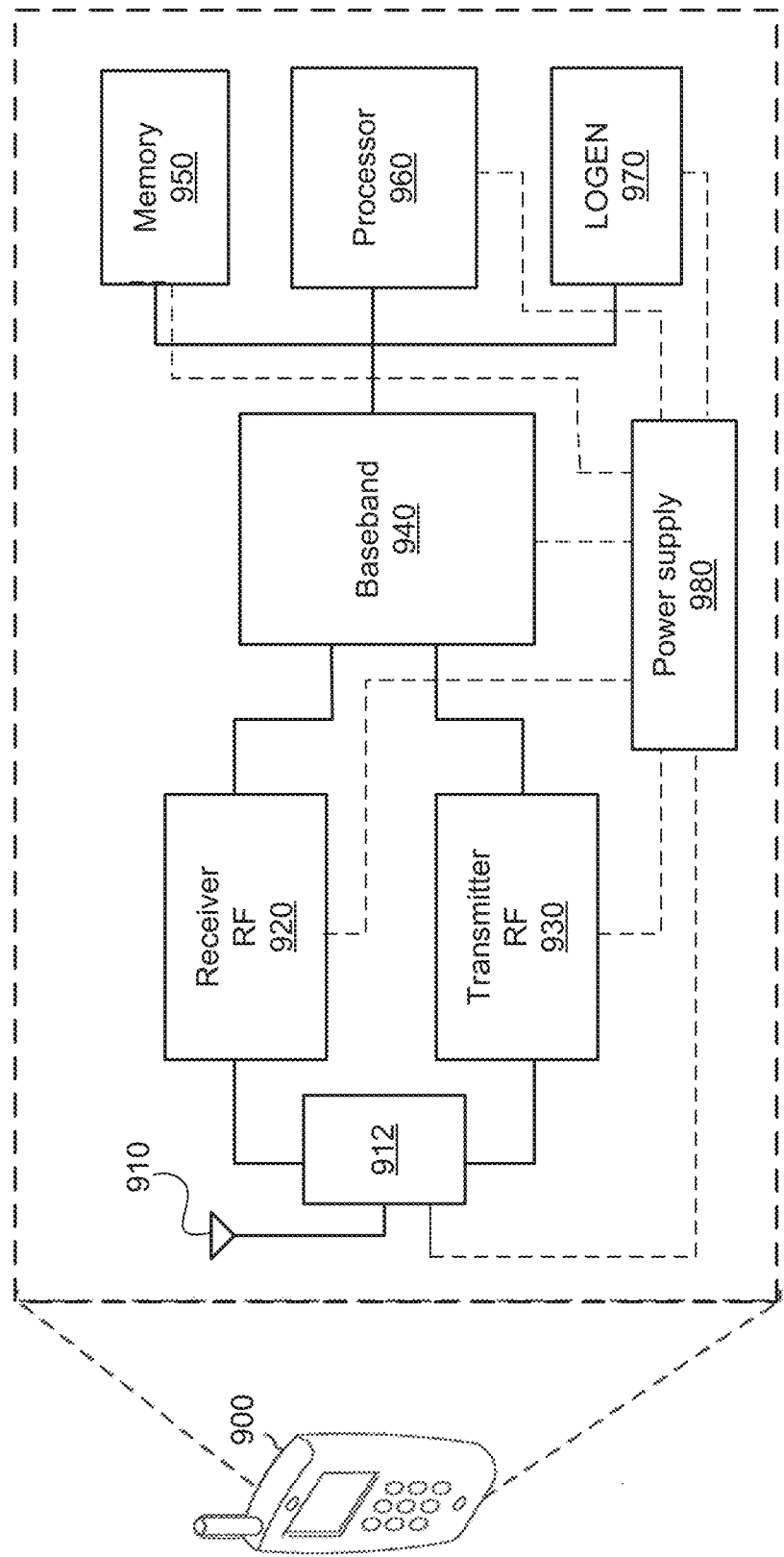
FIG. 9 illustrates an example of a wireless communication device employing features of the subject technology in accordance with one or more implementations.

FIG. 9 illustrates an example of a wireless communication device employing features of the subject technology in accordance with one or more implementations of the subject technology. The wireless communication device 900 includes a radio-frequency (RF) antenna 910, a receiver 920, a transmitter 930, a baseband processing module 940, a memory 950, a processor 460, a local oscillator generator (LOGEN) 970, a power supply 980 and a sensor module 990. In various embodiments of the subject technology, one or more of the blocks represented in FIG. 9 can be integrated on one or more semiconductor substrates. For example, the blocks 920-970 can be realized in a single chip or a single system on chip, or can be realized in a multi-chip chipset.

The RF antenna 910 can be suitable for transmitting and/or receiving RF signals (e.g., wireless signals) over a wide range of frequencies. Although a single RF antenna 910 is illustrated, the subject technology is not so limited.

The receiver 920 comprises suitable logic circuitry and/or code that can be operable to receive and process signals from the RF antenna 910. The receiver 920 may, for example, be operable to amplify and/or down-convert received wireless signals. In various embodiments of the subject technology, the receiver 920 is operable to cancel noise in received signals and can be linear over a wide range of frequencies. In this manner, the receiver 920 is suitable for receiving signals in accordance with a variety of wireless standards. Wi-Fi, WiMAX, Bluetooth, and various cellular standards.

The transmitter 930 comprises suitable logic circuitry and/or code that can be operable to process and transmit signals from the RF antenna 910. The transmitter 930 may, for example, be operable to up-convert baseband signals to RF signals and amplify RF signals. In various embodiments of the subject technology, the transmitter 930 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 930 is operable to provide signals for further amplification by one or more power amplifiers.

The duplexer 912 provides isolation in the transmit band to avoid saturation of the receiver 920 or damaging parts of the receiver 920, and to relax one or more design requirements of the receiver 920. Furthermore, the duplexer 912 can attenuate the noise in the receive band. The duplexer is operable in multiple frequency bands of various wireless standards.

The baseband processing module 940 comprises suitable logic, circuitry, interfaces, and/or code that can be operable to perform processing of baseband signals. The baseband processing module 940 may, for example, analyze received signals and generate control and/or feedback signals for configuring various components of the wireless communication device 900 such as the receiver 920. The baseband processing module 940 is operable to encode, decode, transcode, modulate, demodulate, encrypt, decrypt, scramble, descramble, and/or otherwise process data in accordance with one or more wireless standards.

In some implementations of the subject technology, the baseband processing module 940 can include RX ADCs (e.g., 124 of FIG. 1, or 200 of FIG. 2) and TX DACs (e.g., 126 of FIG. 1, or 300B of FIG. 3B). Further, audio amplifiers such as a class-G amplifier of the headset path (e.g., 522 of FIG. 5B) and earpiece amplifier (e.g., driver 730 of FIG. 7A) can be integrated in the baseband processing module 940.

The processor 960 comprises suitable logic, circuitry, and/or code that can enable processing data and/or controlling operations of the wireless communication device 900. In this regard, the processor 960 is enabled to provide control signals to various other portions of the wireless communication device 900. The processor 960 can also control transfers of data between various portions of the wireless communication device 900. Additionally, the processor 960 can enable implementation of an operating system or otherwise execute code to manage operations of the wireless communication device 900.

The memory 950 comprises suitable logic, circuitry, and/or code that can enable storage of various types of information such as received data, generated data, code, and/or configuration information. The memory 950 includes, for example, RAM, ROM, flash, and/or magnetic storage. In various embodiment of the subject technology, the memory 950 may include a RAM, DRAM, SRAM, T-RAM, Z-RAM, TTRAM, or any other storage media.

The local oscillator generator (LOG EN) 970 comprises suitable logic, circuitry, interfaces, and/or code that can be operable to generate one or more oscillating signals of one or more frequencies. The LOGEN 970 can be operable to generate digital and/or analog signals. In this manner, the LOGEN 970 can be operable to generate one or more clock signals and/or sinusoidal signals. Characteristics of the oscillating signals such as the frequency and duty cycle can be determined based on one or more control signals from, for example, the processor 960 and/or the baseband processing module 940.

In operation, the processor 960 can configure the various components of the wireless communication device 900 based on a wireless standard according to which it is desired to receive signals. Wireless signals can be received via the RF antenna 910 and amplified and down-converted by the receiver 920. The baseband processing module 940 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 950, and/or information affecting and/or enabling operation of the wireless communication device 900. The baseband processing module 940 can modulate, encode and perform other processing on audio, video, and/or control signals to be transmitted by the transmitter 930 in accordance to various wireless standards.

In some implementations, the sensor module 990 includes one or more sensors, such as touch sensors that receive touch signals from a touch screen of the wireless communication device 900. In some aspects, the touch sensor module 990 includes sensor circuits including, for example, sensor drivers and other circuitry that use high breakdown voltage LDMOS of the subject technology.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A CMOS analog and audio front-end circuit, the circuit comprising:
    an enhanced analog-to-digital converter (ADC) configured to achieve a desired signal-to-noise-and-distortion (SNDR); and
    an analog-front-end transmit (TX) digital-to-analog converter (DAC),
    wherein:
    the enhanced ADC includes an improved single Op-Amp resonator coupled to a feed-forward loop, the feed-forward loop being coupled between an input node of the enhanced ADC and a node of a twin-T structure of the improved single Op-Amp resonator, and
    the CMOS analog and audio front-end circuit is integrated with a baseband processor.

2. The circuit of claim 1, wherein:
    the enhanced ADC comprises a sigma-delta ADC,
    the sigma-delta ADC comprises a programmable wideband sigma-delta ADC,
    the desired SNDR comprises more than 70 SNR at 9 MHz,
    the desired SNDR is scalable with power consumption, and
    a lower SNDR corresponds to a lower power consumption.

3. The circuit of claim 2, wherein:
    the enhanced ADC is configured to provide a reduced STF peaking of less than 1 dB,
    the programmable wideband sigma-delta ADC comprises a continuous-time (CT) sigma-delta ADC,
    the enhanced ADC further comprises a DAC feedback configured to couple a delayed output signal of the enhanced ADC to a first internal node of the single Op-Amp resonator, wherein the DAC feedback is configured to reduce the STF peaking of the enhanced ADC to approximately 5 dB.

4. The circuit of claim 1, wherein the feed-forward loop comprises a resistor and an inverter, and wherein the feed-forward loop is configured to further reduce the STF peaking, and wherein the improved single Op-Amp resonator is configured to substantially reduce signal transfer function (STF) peaking of the enhanced ADC.

5. The circuit of claim 1, wherein the enhanced ADC comprises a direct feedback loop that is configured to feed an output signal of the enhanced ADC through a gain stage back to an input of a flash ADC of the enhanced ADC to compensate an excessive loop delay.

6. The circuit of claim 1, wherein the single Op-Amp resonator comprises a bi-quad resonator implemented with a single Op-Amp and is configured to reduce power consumption and loop filter delay.

7. The circuit of claim 1, wherein the analog-front-end TX DAC is configured to provide more than 13-bit linearity and less than 8 nV/sqrtHz noise density at 30 MHz.

8. The circuit of claim 1, wherein:
    the analog-front-end TX DAC comprises a push-pull DAC configured by using only one type of transistor,
    the push-pull DAC is configured by using only PMOS transistors, and
    the push-pull DAC is configured to substantially reduce a drive current, noise, and code-dependent output impedance variation.

9. The circuit of claim 1, wherein:
    the circuit further comprises a high-fidelity audio sub-system configured to provide substantially high linearity,
    the high-fidelity audio sub-system is configured to integrate a headset DAC and a power amplifier into the base-band processor without using a buffer circuit between the headset DAC and the power amplifier,
    the high-fidelity audio sub-system is configured to provide more than 110 dB SNR in a play-back path and more than 92 dB SNR in a capture path,
    the high-fidelity audio sub-system comprises compound complementary switches implemented in laterally-diffused MOS (LDMOS) and configured to close one of a microphone bias path or a data path reliably and level shifters configured to improve total harmonic distortion (THD) for mid-range input voltages.

10. A method of providing a CMOS analog and audio front-end circuit, the method comprising:
    providing an enhanced analog-to-digital converter (ADC) configured to achieve a desired signal-to-noise-and-distortion ratio (SNDR);
    coupling an improved single Op-Amp resonator of the enhanced ADC to a feed-forward loop coupled between an input node of the enhanced ADC and a node of a twin-T structure of the improved single Op-Amp resonator; and
    providing an analog-front-end transmit (TX) digital-to-analog converter (DAC) and configuring the analog-front-end TX DAC to provide a substantial linearity,
    wherein,
    the enhanced ADC and the analog-front-end TX DAC are integrated with a baseband processor.

11. The method of claim 10, wherein:
providing the enhanced ADC comprises providing a sigma-delta ADC,
providing the sigma-delta ADC comprises providing a programmable wideband sigma-delta ADC,
achieving the desired SNDR comprises achieving more than 70 SNR at 9 MHz,
the desired SNDR is scalable with power consumption, and a lower SNDR corresponds to a lower power consumption.

12. The method of claim 11, further comprising:
configuring the enhanced ADC to provide a reduced STF peaking of less than 1 dB,
providing the programmable wideband sigma-delta ADC comprises providing a continuous-time (CT) sigma-delta ADC,
configuring a DAC feedback of the enhanced ADC to couple a delayed output signal of the enhanced ADC to a first internal node of the single Op-Amp resonator, and
configuring the DAC feedback to reduce the STF peaking of the enhanced ADC to approximately 5 dB.

13. The method of claim 10, further comprising:
configuring the improved single Op-Amp resonator to substantially reduce signal transfer function (STF) peaking of the enhanced ADC;
configuring the feed-forward loop by using a resistor and an inverter, and
configuring the feed-forward loop to further reduce the STF peaking.

14. The method of claim 10, further comprising coupling a direct feedback loop to feed an output signal of the enhanced ADC through a gain stage back to an input of a flash ADC of the enhanced ADC to compensate an excessive loop delay.

15. The method of claim 10, wherein the single Op-Amp resonator comprises a bi-quad resonator implemented with a single Op-Amp, and wherein the method comprises configuring the bi-quad resonator to reduce power consumption and loop filter delay.

16. The method of claim 10, further comprising configuring the analog-front-end TX DAC to provide more than 13-bit linearity and less than 8 nV/sqrtHz noise density at 30 MHz.

17. The method of claim 10, further comprising:
configuring a push-pull DAC of the analog-front-end TX DAC by using only one type of transistor,
configuring the push-pull DAC by using only PMOS transistors, and
configuring the push-pull DAC to substantially reduce a drive current, noise, and a code-dependent output impedance variation.

18. The method of claim 10, further comprising:
providing a high-fidelity audio sub-system integrated with the baseband processor,
configuring the high-fidelity audio sub-system to integrate a headset DAC and a power amplifier into the base-band processor without using a buffer circuit between the headset DAC and the power amplifier,
configuring the high-fidelity audio sub-system to provide more than 110 dB SNR in a play-back path and more than 92 dB SNR in a capture path,
implementing compound complementary switches of the high-fidelity audio sub-system in laterally-diffused MOS (LDMOS), and
configuring the compound complementary switches to close one of a microphone bias path or a data path reliably and level shifters configured to improve total harmonic distortion (THD) for mid-range input voltages.

19. A communication device, comprising:
a radio-frequency integrated circuit (RFIC) configured to communicate RF signals; and
a baseband processor coupled to the RFIC, the baseband processor including a CMOS analog and audio front-end circuit comprising:
an enhanced analog-to-digital converter (ADC) including an improved single Op-Amp resonator and configured to achieve a desired signal-to-noise-and-distortion ratio (SNDR); and
an analog-front-end transmit (TX) digital-to-analog converter (DAC),
wherein, the improved single Op-Amp resonator is coupled to a feed-forward loop at a node of a twin-T structure of the improved single Op-Amp resonator, the feed-forward loop being coupled to an input node of the enhanced ADC.

20. The communication device of claim 19, wherein:
the enhanced ADC is configured to provide a reduced STF peaking of less than 1 dB,
the programmable wideband sigma-delta ADC comprises a continuous-time (CT) sigma-delta ADC,
the enhanced ADC further comprises a DAC feedback configured to couple a delayed output signal of the enhanced ADC to a first internal node of the single Op-Amp resonator, wherein the DAC feedback is configured to reduce the STF peaking of the enhanced ADC to approximately 5 dB,
the analog-front-end TX DAC comprises a push-pull DAC configured by using only PMOS transistors,
the circuit further comprises a high-fidelity audio sub-system configured to integrate a headset DAC and a power amplifier into the base-band processor without using a buffer circuit between the headset DAC and the power amplifier and to provide substantial linearity.

* * * * *